United States Patent [19]

Egler

[11] Patent Number: 5,058,139

[45] Date of Patent: Oct. 15, 1991

[54] NOTCH FILTER FOR DIGITAL TRANSMISSION SYSTEM

[75] Inventor: Mark S. Egler, Cambridge, Mass.

[73] Assignee: Siemens Medical Electronics, Inc., Danvers, Mass.

[21] Appl. No.: 565,546

[22] Filed: Aug. 10, 1990

[51] Int. Cl.$^5$ .............................................. H04B 1/10
[52] U.S. Cl. ................................... 375/103; 455/296; 364/723
[58] Field of Search .................... 375/99, 101, 103, 57, 375/58; 364/723, 724.01, 724.1; 371/30, 31; 455/296, 304, 306

[56] References Cited

U.S. PATENT DOCUMENTS

| | | | |
|---|---|---|---|
| 3,988,607 | 10/1976 | Eggermont et al. | 364/724.1 |
| 4,267,605 | 5/1981 | Matsuzawa et al. | 455/266 |
| 4,430,736 | 2/1984 | Scholz | 364/723 |
| 4,815,354 | 3/1989 | Kunimoto | 364/723 |
| 4,847,880 | 7/1989 | Kamerman et al. | 375/103 |
| 4,910,799 | 3/1990 | Takayama | 375/103 |

OTHER PUBLICATIONS

"Digital Filters for ECG Signals", David W. Mortara, Ph. D., Marquette Electronics Incorporated, pp. 511-514.

"Digital Filters for Real-Time ECG Signal Processing Using Microprocessors", Ahlstrom et al., IEEE Transactions on Biomedical Engineering, vol. BME-32, No. 9, Sep. 1985, pp. 709-713.

*Primary Examiner*—Stephen Chin
*Attorney, Agent, or Firm*—Lawrence C. Edelman

[57] ABSTRACT

In a receiver for receiving an information signal including digital information samples which are contaminated with an interference component having known frequency characteristics, a filter is provided having a signal generator responsive to at least a portion of the received signal for generating an output signal having the frequency characteristics of the interference component and an amplitude and phase controlled by the portion of the received signal. A combiner combines the generator output signal with the received signal for generating a filtered output signal having the interference component substantially removed therefrom, which is then applied to an interpolator. In response to the identification of incorrect digital information samples in the received signal, control of the generator by that portion of the received digital information signal which contains the samples identified as incorrect is disabled. In this manner the generator "free-runs" during the receipt of incorrect samples, thereby allowing it to continue to provide samples representative of the known characteristics of the interference component until correct samples are again received.

16 Claims, 1 Drawing Sheet

NOTCH FILTER FOR DIGITAL TRANSMISSION SYSTEM

BACKGROUND OF THE INVENTION

1. Field of the Invention

This invention relates generally to the reduction of interference signals of known frequency characteristics in the receiver portion of a digital transmission system, and more particularly to the use of a notch filter which precedes an interpolator for reducing AC powerline interference signals from a received digital signal.

2. Description of the Prior Art

In a digital transmission system for transmitting information which was originally gathered in analog form, such as a wireless telemetry system using Pulse Code Modulation (PCM) for an analog information signal, occasional samples of the transmitted information can be lost or otherwise received incorrectly due to poor signal strength, radio frequency interference (RFI), or multi-path effects. When samples are lost, the digital receiver is able to detect the loss by using, for example, a checksum or Cyclic Redundancy Check (CRC) type of parity checking technique. The lost samples are then replaced by approximations using any of several known interpolation techniques which use adjacently received correct samples to approximate the lost ones. In this way, transmission errors can be prevented from causing significant distortion in the received signal.

However, problems are frequently encountered if the transmitted signal contains AC line-frequency interference. For example, in instrumentation including sensitive amplifiers, such as an electrocardiograph, AC line-frequency interference is commonly picked up. To reduce line-frequency interference, it is common to include in the signal processing path a notch filter tuned to the line-frequency. Ideally, this filter should be located in the transmitter portion of the system at a point in the signal path prior to the radio frequency (RF) modulator. However, this location is not preferred in order to save space and cost in the transmitter. That is, it is often desirable to have a transmitter which is as small as possible, which consumes relatively little power (and can therefore have a relatively long operating life using batteries) and be of low cost. To include an analog or digital notch filter in the transmitter adversely impacts all of these desired features for the transmitter. Consequently, the desirable and economic alternative is to include the line-frequency notch filter in the receiver. However, as previously noted, an interpolator is normally included in the initial stages of digital signal processing (to compensate for transmission errors), which presents problems since the interpolator must accurately approximate both the original analog information as well as any picked-up AC line-frequency component which was included in the lost digital sample, in order that the notch filter will properly reduce the line-frequency component. Unfortunately, it is expensive to implement an interpolation scheme that will accurately approximate an interference signal of 50 Hz or 60 Hz when the digital sampling frequency is only about 4 times higher (typically 200 to 300 Hz for ECG signals). An interpolation scheme which can accurately approximate both the amplitude and phase of an interference signal which has a frequency which is greater than 20% of the sampling frequency is relatively complex and expensive to implement both in terms of circuit area, components and power consumption. Additionally, since interpolation tends to attenuate or smooth out higher frequencies from a signal, a relatively low cost implementation of an interpolator will leave "dead-spots" in the amplitude envelope of the line-frequency signal component whenever transmission errors occur. These amplitude dead-spots become noise impulses when the line-frequency is removed by the notch filter, which would be located in the signal processing path after the interpolator, because the correct operation of the filter relies on the assumption that the amplitude of the interference will be relatively constant. When a dead-spot is encountered, the notch filter over-compensates for the reduced amplitude dead-spot, thereby generating an impulse noise.

In order to avoid this problem, one may think that simply placing the notch filter in front of the interpolator would be sufficient. However, in this case, since transmission errors will randomly cause some of the received samples to incorrectly have a very large amplitude, this will perturb the output of the notch filter for several sample periods following each incorrect sample, due to the transient response of the filter, e.g., ringing. The interpolator will provide an estimated sample to correct for each incorrect sample, but cannot compensate for the filter perturbation, which will then generally manifest itself in the form of an exponentially decaying sinusoid superimposed on the interpolator output signal.

It is an object of the present invention to provide a low-cost and more effective solution for reducing the presence of unwanted signals having known frequency characteristics from a received digital signal.

SUMMARY OF THE INVENTION

In accordance with the principles of the invention, a receiver for receiving an information signal including digital information samples which are contaminated with an interference component having known frequency characteristics comprises, receiving means for receiving and processing the information signal and providing at its output a received signal including digital information samples contaminated with the interference component, filter means responsive to the received signal for filtering the interference component from the received signal, the filter means including a generator means responsive to at least a portion of the received signal for generating an output signal having the frequency characteristics of the interference component and an amplitude and phase controlled by the portion of the received signal, and means for combining the generator output signal with the received signal for generating a filtered output signal having said interference component substantially removed therefrom. Interpolator means responsive to the filtered output signal generates interpolated digital information samples as replacements for digital information samples identified as incorrect. Means are also provided for identifying the incorrect digital information samples in the received signal, and in response to the identification, disabling control of the generator means by that portion of the received digital information signal which contains the samples identified as incorrect. In this manner, the generator means "free-runs" during the receipt of incorrect samples, thereby allowing it to continue to provide samples representative of the known characteristics of the interference component until correct samples are again received. In a preferred embodiment of the invention the interference component comprises a sinusoid, the filter means comprises a notch-frequency filter and the generator means comprises a sine wave oscillator.

DETAILED DESCRIPTION OF THE PREFERRED EMBODIMENTS

Figure 1:
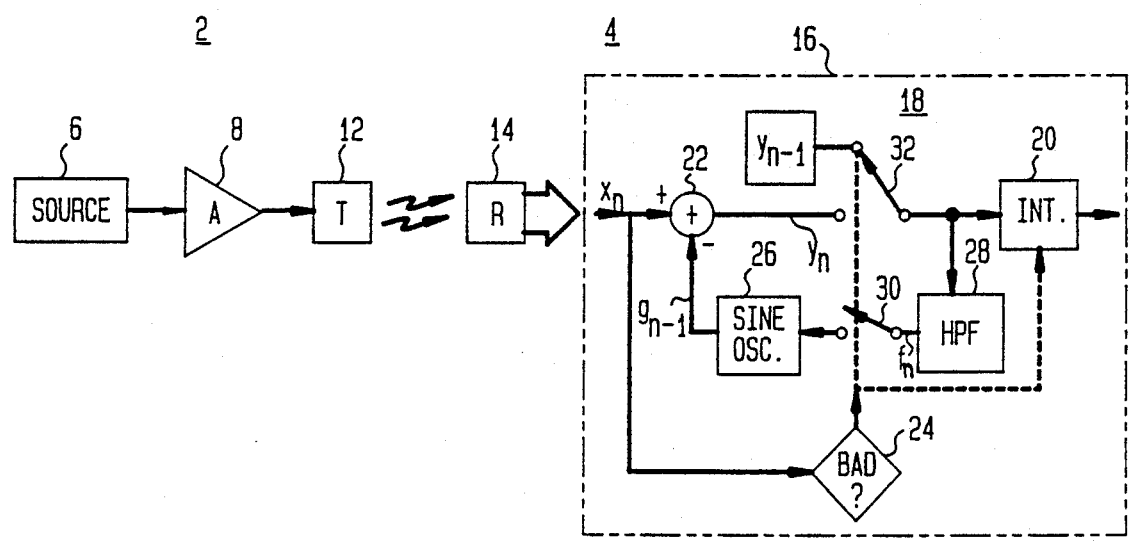
FIG. 1 illustrates conceptually in block diagram form a digital information transmission system embodying the principles of the present invention.

As shown in FIG. 1, the digital information transmission system includes a transmitter section 2 for transmitting digitized analog information, using for example pulse code modulation (PCM) techniques, to a receiver section 4. Although this transmission is illustrated as being wireless, the principles of the invention apply just as advantageously to a wired communication system. A signal source 6 provides, for example, analog information signals, and may comprise, for example, the ECG signal pick-up portion of an electrocardiograph machine. These analog signals are processed and amplified in amplifier section 8 and then digitally transmitted as a sequence of samples by a transmitter 12 using, for example, a pulse code modulation (PCM) technique. The sequence of samples define the frequency, amplitude and phase components of the original analog information, as well the picked-up line-frequency interference components, due to, for example, common-mode electromagnetic interference signals which are amplified by sensitive instrumentation amplifiers of the ECG machine. A receiver section 14 receives the transmitted information signal. The effects of these line-frequency interference components upon the digital information are advantageously reduced by the novel notch-filter-/interpolator arrangement 16 of the present invention.

Although block diagram arrangement 16 could be carried out in analog form, it is noted that in the preferred embodiment the implementation is actually carried out digitally in a microprocessor (not specifically shown) which is included in receiver 4. Arrangement 16 basically comprises a notch-frequency filter section 18 followed by an interpolator 20. Each sample $x_n$ of the received signal (x) is simultaneously applied to the positive input of a summing function 22 and a portion 24 of the microprocessor which checks the parity of the received information samples for determining if each sample is correct or incorrect (i.e., has been corrupted by transmission errors.)

Notch filter 18 includes a sine wave oscillator 26 which generates sine wave samples $g_n$ having the frequency of the line-frequency interference component. Furthermore, sine wave oscillator 26 is controlled by a high-pass filter arrangement 28 so as to cause sine wave samples $g_n$ to track the phase and amplitude of the input line-frequency interference signal. The generated sine wave samples are applied so as to be subtracted from the input information samples at summing function 22. In the event that an incoming information sample is incorrect, sine wave oscillator 26 is disconnected from, i.e., not controlled by, the output of high-pass filter 28 and is allowed to "free-run". This disconnection is shown symbolically by the operation of a switch 30 driven by the decision making portion 24 of the microprocessor which indicates that a incorrect sample has been identified in the received signal. Furthermore, in order to prevent perturbations in high-pass filter 28, a second symbolic switch arrangement 32 is illustrated which applies to high-pass filter 28 and interpolator 20 an output sample ($y_{n-1}$) which preceded the currently identified incorrect sample.

In operation, sine wave oscillator 26 is set to oscillate at the line-frequency (either 50 Hz or 60 Hz), with its amplitude and phase controlled by feedback information from the output of high-pass filter 28 so that its output amplitude matches that of the input signal (x) line-frequency component and its phase is in opposition to the phase of the input line-frequency component. Summing function 22 adds the input signal and the output signal (g) of the sine oscillator together, which causes the line-frequency component of the input signal (x) to be substantially reduced in the output signal (y) of notch filter arrangement 18. High-pass filter 28 takes the output of summing function 22 as its input and attenuates the amplitude of these signals in inverse proportion to their frequency. The output signal ($f_n$) of high-pass filter 28 is then attenuated and used as the feedback information to control the amplitude and phase of the samples $g_n$ provided by sine wave oscillator 26. It is noted that the ECG portion of input signal (x) is not sinusoidal and also does not have significant high-frequency components. Thus, it does not match the output of oscillator 26 and is passed without attenuation to the input of interpolator 20. It is also noted that the degree of attenuation of output signal (f) determines the overall width of the notch in the frequency response of notch filter arrangement 18.

Symbolic switch 30 connects the attenuated output of high-pass filter 28 to the input of sine wave oscillator 26. This switch is opened only when the input sample $x_n$ is identified by microprocessor portion 24 as incorrect due to, e.g., radio transmission errors. When switch 30 is open, sine wave oscillator 26 continues with the known phase and amplitude output signal sample sequence $g_n$ that it had before switch 30 was opened. Thus, no feedback control exists during this time and the oscillator is allowed to "free-run", thereby continuing to provide samples representative of a sinusoid until correct samples are again received.

Symbolic switch 32 connects the output of summing function 22 to the input of high-pass filter 28. When incorrect information samples are detected, switch 32 disconnects the input of interpolator 20 and high-pass filter 28 from summing function 22 and instead, for example, passes the most recent correct output sample $y_{n-1}$ to their inputs.

In this manner, oscillator 26 and high-pass filter 28 are not disturbed by incorrect samples and yet are allowed to continue to operate when incorrect information samples are received so that the notch filter will be ready to continue to remove line-frequency interference from the signal when correct samples are again detected as being received. Additionally, it is noted that when an incorrect sample is detected by microprocessor portion 24, interpolator 20 is also instructed (as indicated by the dashed line therebetween) to derive an approximation of the correct value for that particular sample. The remainder of the receiver circuitry is conventional and therefore not specifically shown or described.

As previously noted, interpolator 20 can be of conventional design and in the present case, interpolation is done using different equations for each time sequence of correct and incorrect information samples. The equations are based on the known cubic Lagrangian interpolation formula where four or more correct samples are available around the incorrect sample, or a lower order interpolation, e.g., parabolic, for three samples and linear for two.

Figure 2:
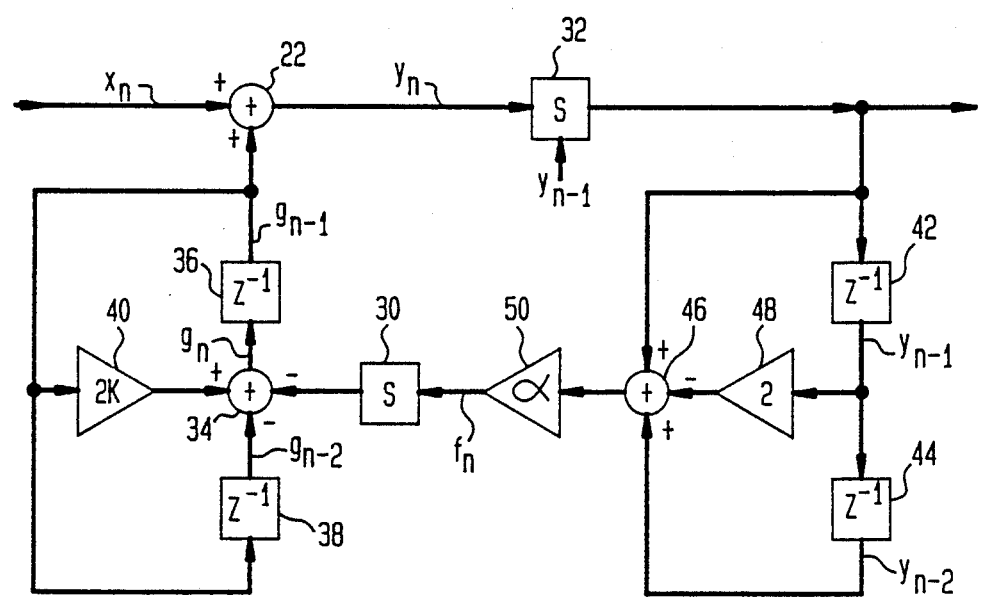
FIG. 2 illustrates details of a digital implementation of the sine wave oscillator/notch filter combination shown in FIG. 1.

FIG. 2 illustrates conceptually details of microprocessor controlled processing for implementation of notch filter arrangement 18. Like parts of FIGS. 1 and 2 are referred to with similar reference numbers. The operation of arrangement 18 can be described by the following equation:

$$y_n = x_n + g_{n-1} \quad (1)$$

wherein x and y represent the input and output information samples, respectively, and $g_{n-1}$ represents the output of sine wave oscillator 26 which has been controlled to have the same amplitude but opposite phase of the line-frequency interference.

Sine wave oscillator 26 basically operates in accordance with the following equation implemented in the microprocessor:

$$g_n = 2Kg_{n-1} - g_{n-2} - \alpha f_n \quad (2)$$

As shown in detail in FIG. 2, the equation defining sine wave oscillator 26 is implemented using a summing function 34 which receives at a first inverting input the output of switch 30, and includes two unit-time delays 36 and 38 for delaying a sample value at the output of summing function 34 two time periods and applying the twice delayed signal $g_{n-2}$ to the other inverting input of summing function 34. A once delayed signal $g_{n-1}$ is applied to the non-inverting input of summing function 34 via an amplifier 40 having a gain of 2 K. K is defined as cos (2 $\pi$ $F_{notch}/F_{sample}$) wherein $F_{notch}$ equals the notch frequency (50 or 60 Hz) and $F_{sample}$ equals the sample frequency (200 Hz).

High-pass filter 28 operates in accordance with the following equation implemented in the microprocessor:

$$f_n = y_n - 2y_{n-1} + y_{n-2}$$

and comprises two unit-time delays 42 and 44 for developing once and twice delayed output samples $y_{n-1}$ and $y_{n-2}$. The once delayed signal is applied to an inverting input of a summing function 46 via an amplifier 48 having a gain of two and the twice delayed signal is applied to a non-inverting input of summing function 46. Additionally, the output signal $y_n$ of summing function 22 is also applied to a further non-inverting input of summing function 46. The output of summing function 46 is indicated as $f_n$, which is applied to an attenuator 50 having a gain of $\alpha$. The value of $\alpha$ defines the narrowness of the notch, as illustrated by its effect upon the equation which describes the operation of sine wave oscillator 26. In the preferred embodiment, $\alpha = 1/64$.

The novel arrangement described above can also be used for correcting "clock-slip" errors. "Clock-slips" are the loss or gain of single samples due to slight differences in crystal frequencies between the transmitter and receiver portions. In this case, the microprocessor identifies those information samples which follow a skipped sample and those information samples that are repeats of a preceding sample. If the microprocessor indicates that a sample has been skipped, notch filter arrangement 18 is first caused to operate as if an incorrect sample were detected (such operation being previously described) and then caused to operate with the next sample as its input. If a repeated sample has been sensed, notch filter arrangement 18 is simply disabled for one clock-cycle and then re-enabled for the next. In this manner, sine wave oscillator 26 will always stay in phase with the line-frequency interference component and correct filtering should occur.

Thus, there has been shown and described a novel notch filter arrangement for a digital transmission system which fulfills all the objects and advantages sought therefor. Many changes, modifications, variations and other uses and applications of the invention will, however, be apparent to those skilled in the art after considering this specification and the accompanying drawings which disclose a preferred embodiment thereof. For example, notch filter arrangement 18 can be implemented using discrete digital hardware instead of in a microprocessor. Furthermore, the function of high-pass filter 28 can be accomplished with any of several known amplitude/frequency transfer functions, as long as the amplitude is attenuated in response to decreases in frequency. In fact, the interference component can be any signal having known (i.e., reproducible) characteristics, such as a line-frequency signal with multiple harmonics. All such changes, modifications, variations and other uses and applications which do not depart from the spirit and scope of the invention are deemed to be covered by the invention which is limited only by the claims which follow.

I claim:

1. A receiver for receiving an information signal including digital information samples which are contaminated with a known-frequency interference component, comprising:
   receiving means for receiving and processing said information signal and providing a received signal including digital information samples contaminated with said interference component;
   identification means responsive to said received signal for analyzing said received signal and providing an identification signal in response to identification of an incorrect sample in said received signal;
   notch-frequency filter means responsive to said received signal for filtering said interference component from said received signal, said notch-frequency filter means including signal processing means responsive to at least a portion of said received signal for generating a control signal and an oscillator means controlled in response to said control for generating an oscillator output signal having the frequency of said interference component and an amplitude and phase control by said portion of the received signal so as to track the amplitude and phase of said interference component, control of said oscillator by said control signal being disabled by said identification signal, and means for combining said oscillator output signal with said received signal for generating a filtered output signal; and
   interpolator means responsive to said filtered output signal for generating interpolated digital information samples as replacements in said filtered output signal for digital information samples identified as incorrect.

2. The receiver of claim 1, wherein:
   said signal processing means comprises a filter means which amplitude vs. frequency filters said received signal.

3. The receiver of claim 2, wherein:
said filter means comprises a high-pass filter.

4. The receiver of claim 1, wherein:
said oscillator means develops a signal comprising a sequence of samples, said sequence being a digital representation which tracks the frequency, amplitude and phase of said interference component.

5. The receiver of claim 2, wherein said notch-frequency filter means further includes:
a first switching function for normally applying the output of said filter means as said control signal to said oscillator means, but which is responsive to said identification signal for disabling application of said control signal to said oscillator means during the time period of samples identified as incorrect in said received signal.

6. The receiver of claim 5, wherein said notch-frequency filter means further includes:
a second switching function for normally applying the output of said combining means to said interpolator means, but which is responsive to said identification signal for disabling application of the output of said combining means to said interpolator means during the time period of samples identified as incorrect in said received signal.

7. The receiver of claim 6, wherein:
in response to said identification signal, said second switching function applies to said interpolator means a sample from the output of said combining means which precedes the sample identified as incorrect.

8. A method for receiving an information signal including digital information samples which are contaminated with a known-frequency interference component, comprising the following steps in the named order;
receiving and processing said information signal for providing a received signal including digital information samples contaminated with said interference component;
analyzing said received signal for providing an identification signal in response to identification of an incorrect sample in said received signal;
notch-frequency filtering said interference component from said received signal, said notch-frequency filtering comprising the steps of generating an oscillator output signal having the frequency of said interference component and an amplitude and phase controlled by at least a portion of the received signal so as to track the amplitude and phase of said interference component, disabling control of the amplitude and phase of said oscillator output signal in response to said identification signal, combining said oscillator output signal with said received signal for generating a notch-frequency filtered output signal; and
applying said notch-frequency filtered output signal to an interpolator means for generating interpolated digital information samples as replacements in said notch-frequency filtered output signal for digital information samples identified as incorrect.

9. The method of claim 8, including the further step of:
amplitude vs. frequency filtering said received signal for developing a filter output signal comprising said portion of said received signal which is applied to control said oscillator output signal.

10. The method of claim 9, wherein:
said amplitude vs. frequency filtering step comprises high-pass filtering.

11. The method of claim 8, wherein:
said step generating said oscillator output signal generates a signal comprising a sequence of samples, said sequence being a digital representation which tracks the frequency, amplitude and phase of said interference component.

12. The method of claim 9, wherein said notch-frequency filtering step further includes:
a first switching function for normally applying said filter output signal to control said oscillator output signal, but which is responsive to said identification signal for disabling said control of said oscillator output signal during the time period of samples identified as incorrect in said received signal.

13. The method of claim 12, wherein said notch-frequency filtering step further includes:
a second switching function for normally applying said notch-frequency filtered output signal to said interpolator means, but which is responsive to said identification signal for not applying said notch-filtered output signal to said interpolator means during the time period of samples identified as incorrect in said received signal.

14. The method of claim 13, wherein:
in response to said identification signal, said second switching function applies to said interpolator means a sample of said notch-frequency filtered output signal which precedes the sample identified as incorrect.

15. A receiver for receiving an information signal including digital information samples which are contaminated with an interference component having known frequency characteristics, comprising:
receiving means for receiving and processing said information signal and providing a received signal including digital information samples contaminated with said interference component;
identification means responsive to said received signal for analyzing said received signal and providing an identification signal in response to identification of an incorrect sample in said received signal;
filter means responsive to said received signal for filtering said interference component from said received signal, said filter means including a generator means controlled in response to at least a portion of said received signal for generating an output signal having the known frequency characteristics of said interference component and an amplitude and phase controlled by said portion of the received signal so as to track the amplitude and phase of interference component, control of said generator in response to at least a portion of said received signal being disabled by said identification signal, and means for combining said generator output signal with said received signal for generating a filtered output signal; and
interpolator means responsive to said filtered output signal for generating interpolated digital information samples as replacements in said filtered output signal for digital information samples identified as incorrect.

16. The receiver of claim 15, wherein:
said interference component comprises a sinusoidal signal;
said filter means comprises a notch-frequency filter; and
said generator means comprises an oscillator.

* * * * *

UNITED STATES PATENT AND TRADEMARK OFFICE
CERTIFICATE OF CORRECTION

PATENT NO. : 5,058,139

DATED : October 15, 1991

INVENTOR(S) : Egler

It is certified that error appears in the above-identified patent and that said Letters Patent is hereby corrected as shown below:

Column 6
 Line 50:

Before "for generating" insert --signal--; and

Line 52:

Delete "control" and in its place insert --controlled--.

Signed and Sealed this

Twenty-third Day of February, 1993

*Attest:*

STEPHEN G. KUNIN

*Attesting Officer*     *Acting Commissioner of Patents and Trademarks*